United States Patent [19]
Takagi

[11] Patent Number: 5,397,738
[45] Date of Patent: Mar. 14, 1995

[54] PROCESS FOR FORMATION OF HETEROEPITAXY

[75] Inventor: Norimitsu Takagi, Kawasaki, Japan

[73] Assignee: Fujitsu Ltd., Kawasaki, Japan

[21] Appl. No.: 45,174

[22] Filed: Apr. 13, 1993

[30] Foreign Application Priority Data

Apr. 15, 1992 [JP] Japan ................... 4-095635

[51] Int. Cl.[6] ............................................ H01L 21/20
[52] U.S. Cl. ............................ 437/126; 437/107; 437/132; 437/133; 437/946; 117/88; 117/90
[58] Field of Search ............... 437/102, 104, 105, 107, 437/126, 132, 133, 946; 156/612, 613; 117/88, 90

[56] References Cited

U.S. PATENT DOCUMENTS 4,808,551  2/1989  Mori et al. ..................... 437/132

FOREIGN PATENT DOCUMENTS 0245512  2/1989  Japan ..................... 437/132
1-212296  8/1989  Japan .
2094431  4/1990  Japan ..................... 156/612

OTHER PUBLICATIONS

"AsH3 preflow effects on initial stages of GaAs grown on Si by metalorganic chemical vapor deposition," Fujita, Kazuhisa and Koyu Asai, *Applied Physics Letter* 59 (26), Dec. 23, 1991, pp. 3458–3460.

Bringans et al. in "The effect of a Ga prelayer on the beginning of a GaAs epitaxy on Si" in J. Appl. Phys. 64(7), Oct. 1988, pp. 3472–3475.

Georgakilas et al. "Achievements and limitations in optimised GaAs films grown on Si by molecular beam epitaxy" J. Appl. Phys 71(6), 15 Mar. 1992, pp. 2679–2701.

Lee in "MBE growth of low dislocation and high mobility GaAs on Si" Mat. Res. Soc. Sym. Proc. vol. 67, (1986), pp. 29–36.

Primary Examiner—R. Bruce Breneman
Assistant Examiner—Ramamohan Rao Paladugu
Attorney, Agent, or Firm—Staas & Halsey

[57] ABSTRACT

A process of the formation of heteroepitaxy including heating a silicon substrate in gas ambience including one of a hydride of a IIIB group element and an organic substance of a IIIB group element, having the IIIB group element remain on the surface of the silicon substrate, and growing a GaAs film on a surface of the silicon substrate after the heat processing. Particles remaining on an inner wall or the like of a film forming apparatus are prevented from reaching the surface, and a IIIB group element remains on the surface after preprocessing. Such a GaAs film formed on the surface includes less unevenness and crystal defects.

7 Claims, 9 Drawing Sheets

FIG.1

(Prior Art)

```
PREBAKING PROCESS
  H₂ GAS: FLOW RATE OF 12SLM
  TEG/H₂ GAS: TEG TEMPERATURE AT 15°C
              H₂ GAS FLOW RATE OF 100SCCM
  INTERNAL PRESSURE OF REACTOR: 76Torr
  PROCESSING TEMPERATURE: 875°C
  PROCESSING TIME: 10MINUTES
```

FIG. 6

```
PREBAKING PROCESS
  H₂ GAS: FLOW RATE OF 12SLM
  B₂H₆/H₂ GAS: B₂H₆ TEMPERATURE AT 15°C
               H₂ GAS FLOW RATE OF 100SCCM
  INTERNAL PRESSURE OF REACTOR: 76Torr
  PROCESSING TEMPERATURE: 1000°C
  PROCESSING TIME: 10MINUTES
```

PROCESS FOR FORMATION OF HETEROEPITAXY

BACKGROUND OF THE INVENTION

1. Field of the Invention

The present invention relates to a process of the formation of heteroepitaxy including a process of preprocessing of a surface, and more particularly to a process of the formation of heteroepitaxy for forming a GaAs-on-Si substrate by growing a GaAs film on a silicon substrate after preprocessing a surface of a silicon substrate.

2. Description of the Prior Art

GaAs is used as a compound semiconductor substrate for forming a high speed transistor such as a HEMT.

GaAs-on-Si in which a GaAs film is formed on a silicon substrate has attracted attention in recent years as such a substrate. Since GaAs-on-Si has high mechanical strength as compared with a GaAs bulk substrate and is easy to obtain a large diameter, it is easy to handle and suitable for mass production. Therefore, there is a big demand for practical use for the process of the formation of GaAs-on-Si. However, a GaAs grown film formed by an MOCVD method or the like has defects in many cases since crystal lattice constants of the Si substrate and the GaAs grown film are different from each other (Si: 5.4307 Å, GaAs: 5.6537 Å). Accordingly, a process of the formation of heteroepitaxy which solves such a problem and is capable of aiming at improvement of crystallinity of a GaAs grown film is being demanded.

Figure 1:
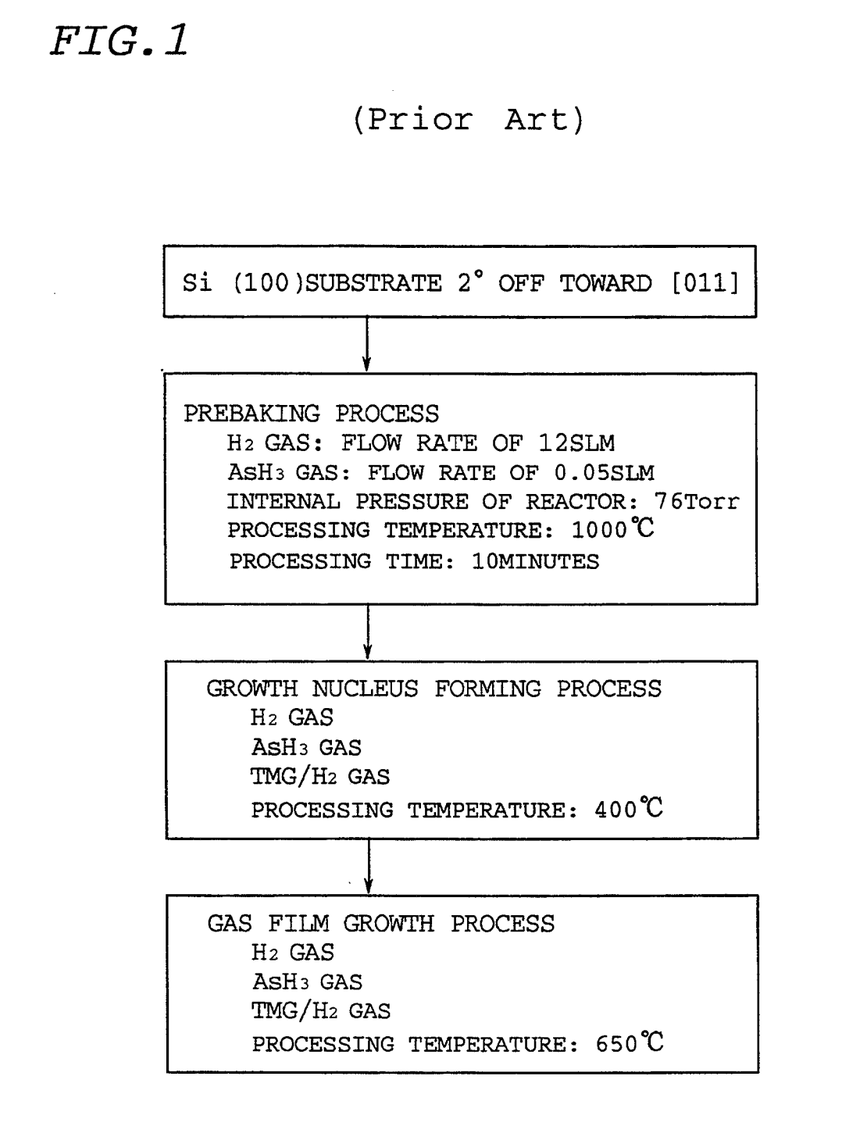
FIG. 1 is a flow chart for explaining a process of the formation of GaAs-on-Si according to a prior art.

FIG. 1 is a flow chart for explaining a process of the formation of heteroepitaxy according to a prior art, which is a process of forming a GaAs film on a Si substrate by an MOCVD method.

First, the pressure is decreased after placing a Si substrate on a placing table in a chamber of an MOCVD apparatus. The Si substrate has a (100) plane being 2° off toward [011].

When a predetermined pressure is reached, hydrogen ($H_2$) gas having a flow rate of 12 SLM and arsine ($AsH_3$) gas having a flow rate of 0.05 SLM are introduced into a chamber, thus maintaining the pressure at 76 Torr. Furthermore, in order to remove a natural oxide film on the surface of the Si substrate, heat processing is applied for 10 minutes under the condition of the substrate temperature at 1,000° C. At this time, since the circumference of the silicon substrate is covered by $AsH_3$ gas, particles remaining on an inner wall of the MOCVD apparatus is prevented from reaching to the Si substrate.

Next, in order to form a GaAs initial film which becomes a growth nucleus on the grown plane of the Si substrate, hydrogen ($H_2$) gas, arsine ($AsH_3$) gas and hydrogen gas containing trimethylgallium (TMG) are introduced into the chamber after the substrate temperature is lowered to 400° C. When this state is maintained for a predetermined period of time, the GaAs initial film having a predetermined film thickness is grown on the Si substrate.

Then, the temperature of the Si substrate is raised and maintained at 600° C. In succession, $H_2$ gas, $AsH_3$ gas and $H_2$ gas containing trimethylgallium (TMG) are introduced into the chamber. When this state is maintained for a predetermined period of time, a GaAs single crystal layer having a predetermined film thickness is grown. With this, a heteroepitaxy having a GaAs-on-Si structure is fabricated.

However, it has become clear that unevenness on the surface of the GaAs single crystal layer is large when the surface of the GaAs single crystal layer grown by the above-mentioned process is observed by atomic force microscopy (AFM). Further, it has also become clear that the surface of the GaAs single crystal layer is etched and there are many lamination defects on the surface of the GaAs single crystal layer when etch pits are observed.

When densification and micro-patterning of a semiconductor device are demanded, the existence of unevenness and crystal defects on the surface of the GaAs single crystal layer becomes a serious obstacle in element fabrication. For example, unevenness of the surface becomes an obstacle in patterning, and crystal defects cause deterioration of characteristics such as increase of a leak current of a transistor and decrease of life time.

Besides, a preprocessing process of heat treatment of a surface of a Si substrate in the $AsH_3/H_2$ gas mixture has been known, but such a problem that a Si substrate surface becomes rough when heat treatment is performed at high temperature of 1,000° C. is described in Applied Physics Letter 59(26), Dec. 23, 1991, pp. 3458–3460.

Further, there is such a preprocessing process of heat treatment at a low temperature in gas composed of a chloride of a IIIB group element. This is a process of removing a natural oxide film existing on the surface of a silicon substrate before the growth of a GaAs film through a chemical reaction with gas composed of chloride of a IIIB group element, in which the silicon substrate is exposed to the gas so as to have chlorine and silicon react to each other and gallium and oxygen react to each other so as to evaporate the natural oxide film.

SUMMARY OF THE INVENTION

It is an object of the present invention to provide a process of the formation of heteroepitaxy including such a preprocessing process that particles remaining on an inner wall or the like of a film forming apparatus are prevented from reaching a surface of a silicon substrate in case of preprocessing and a surface capable of forming a GaAs film having little unevenness and crystal defects of the surface is obtainable.

A process of the formation of heteroepitaxy according to the present invention includes a process of heating a silicon substrate in gas composed of a hydride or an organic substance of a IIIB group element such as diborane ($B_2H_6$), trimethylgallium (TMG) or triethylgallium (TEG) and leaving the IIIB group element behind on the surface of the silicon substrate, and a process of growing a GaAs film on the surface of the silicon substrate after processing described above. Since the silicon substrate is applied with heat treatment in gas composed of a hydride or an organic substance of a IIIB group element before the GaAs film is formed, the natural oxide film formed on the surface of the silicon substrate is governed by a temperature rise by heating rather than by the chemical reaction with gas and is thus removed. Further, since the silicon substrate is covered by the gas composed of a hydride or an organic substance of a IIIB group element, particles remaining on the inner wall or the like of the film forming apparatus are prevented from reaching the silicon substrate. Moreover, since the gas composed of a hydride or an organic substance of a IIIB group element scarcely reacts with the natural oxide film, the IIIB group element in the gas remains on the surface of the silicon substrate after heat treatment. It has been ascertained experimentally that unevenness on the surface becomes smaller and crystal defects become less in the GaAs film formed on the surface of the silicon substrate after such preprocessing.

Further, a silicon substrate used in a process of the formation of heteroepitaxy of the present invention has a (100) crystal plane being 1° to 4° off toward <011> to be more concrete.

DESCRIPTION OF THE PREFERRED EMBODIMENT

In the next place, an embodiment of the present invention will be described with reference to the drawings.

Figure 10:
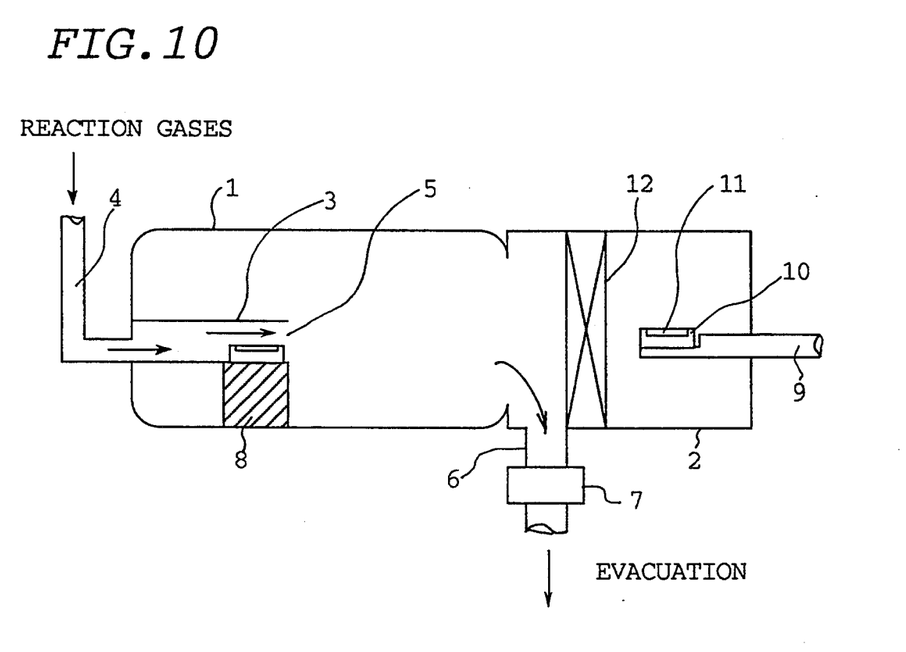
FIG. 10 is a structural view of an MOCVD apparatus used for formation of GaAs-on-Si according to an embodiment of the present invention.

(1) A process of the formation of GaAs-on-Si according to an embodiment of the present invention (a) Description of an MOCVD apparatus used for formation of GaAs-on-Si according to an embodiment of the present invention FIG. 10 is a side view for explaining a structure of an MOCVD apparatus used for formation of GaAs-on-Si according to an embodiment of the present invention.

A reference numeral 1 represents a chamber, and 2 represents a load lock chamber connected to the chamber 1 through a valve 12 capable of opening and shutting. In the load lock chamber 2, an exhauster not illustrated is connected so that an internal pressure may be regulated. Further, when a Si substrate (a wafer) 11 is taken in and out of the chamber 1, the internal pressure is reduced so as to show a pressure at almost the same level as the pressure inside the chamber 1. With this, it becomes possible to always maintain a pressure reduction state inside the chamber 1.

3 represents a cylindrical reactor (a growth chamber) having a square section, and a GaAs film is grown in this reactor 3. One end of the reactor 3 is formed into a gas inlet port 4 for introducing reaction gas. Further, the other end of the reactor 3 is formed into a wafer inlet and outlet port 5 for carrying in the wafer 11 into the reactor 3 or carrying it out of the reactor 3. Further, the other end of the reactor 3 also acts as a gas blow-off port for blowing off unnecessary reaction gas into the chamber 1 outside of the reactor 3. 6 represents an exhaust port where an exhaust pump 7 is connected, through which the inside of the chamber 1 and the inside of the reactor 3 are exhausted and unnecessary reaction gas blown off through the wafer inlet and outlet port 5 is also discharged outside of the chamber 1. 8 represents a susceptor provided on the underside of the reactor 3 and having a heater, on which a wafer tray 10 holding the Si substrate 11 is placed for heating.

9 represents a substrate conveyor unit for carrying the wafer tray 10 holding the wafer 11 out of the load lock chamber 2 and carrying the wafer tray 10 into the load lock chamber 2.

Besides, in order to form GaAs-on-Si, it is also possible to use a film forming apparatus by molecular beam epitaxy (MBE) or atomic layer epitaxy (ALE) other than the above-mentioned metal organic chemical vapor deposition (MOCVD) apparatus.

Figure 2:
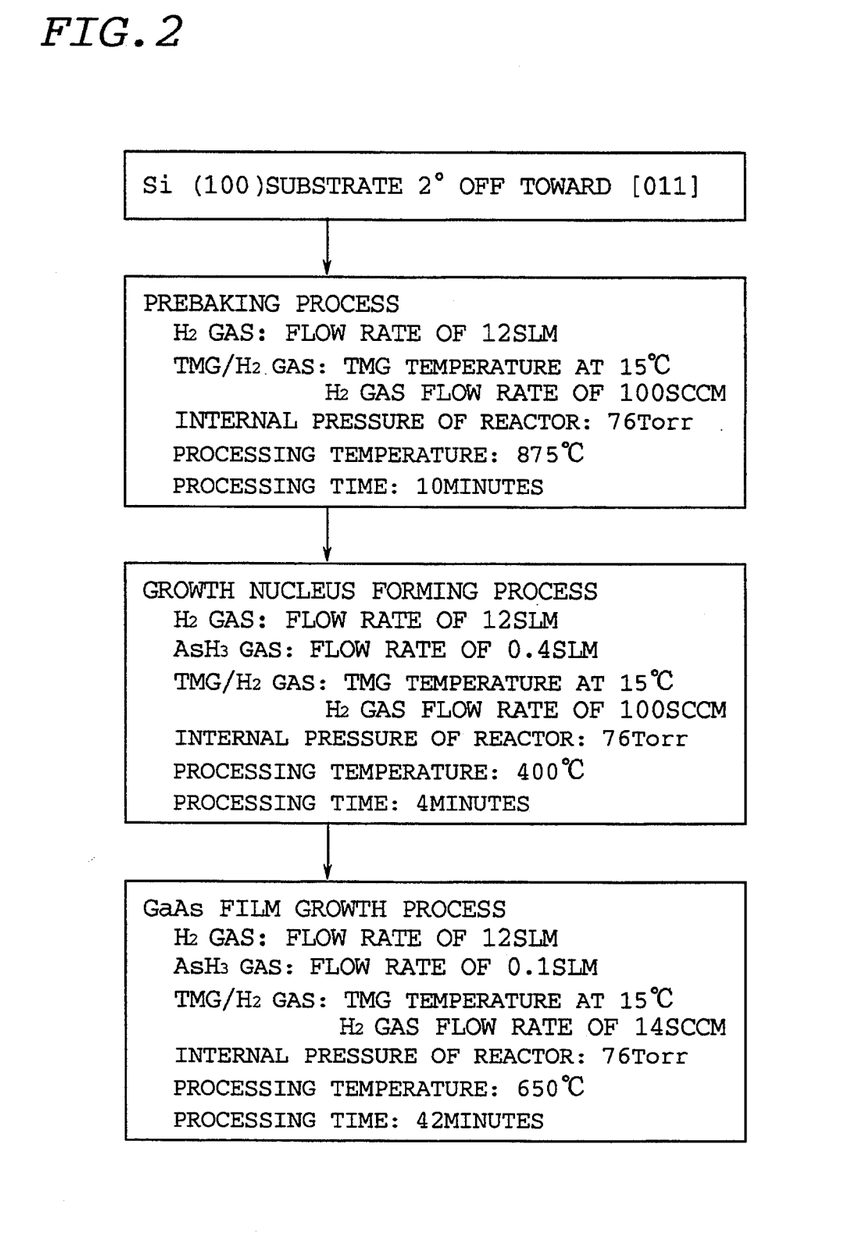
FIG. 2 is a flow chart for explaining a process of the formation of GaAs-on-Si according to an embodiment of the present invention.
Figure 3:
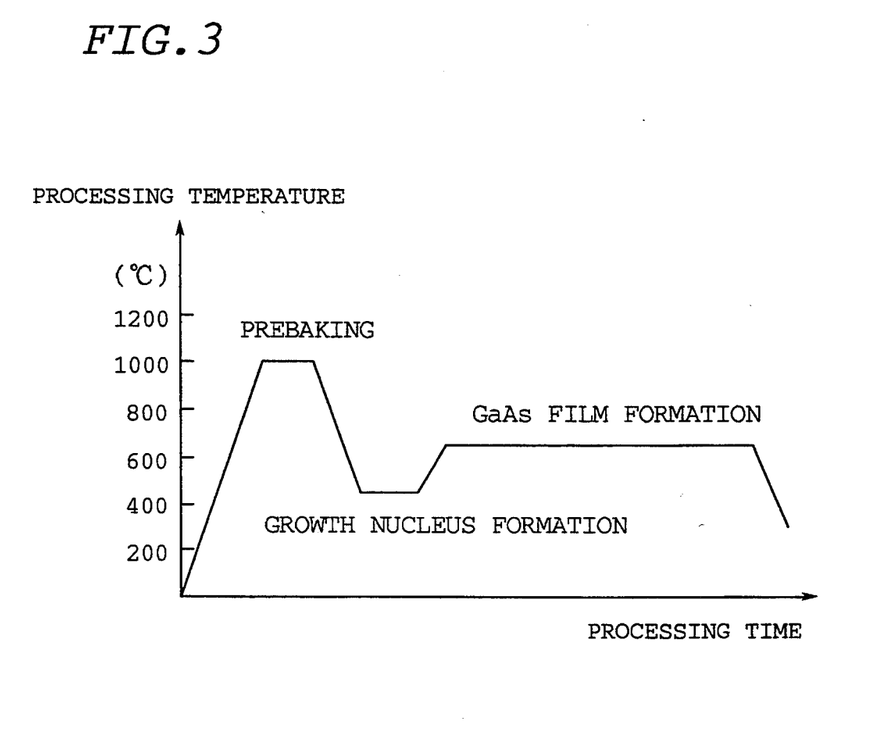
FIG. 3 is a time chart for explaining temperature sequence in a growth process of a GaAs film according to an embodiment of the present invention.

(b) A process of the formation of GaAs-on-Si according to an embodiment of the present invention FIG. 2 is a flow chart for explaining a process of the formation of GaAs-on-Si according to an embodiment of the present invention. FIG. 3 is a time chart showing temperature sequence from the start of prebaking to the end of formation of a GaAs film according to an embodiment of the present invention. FIGS. 4(a) to 4(d) are sectional views for explaining a process of the formation of GaAs-on-Si according to an embodiment of the present invention.

Figure 4A:
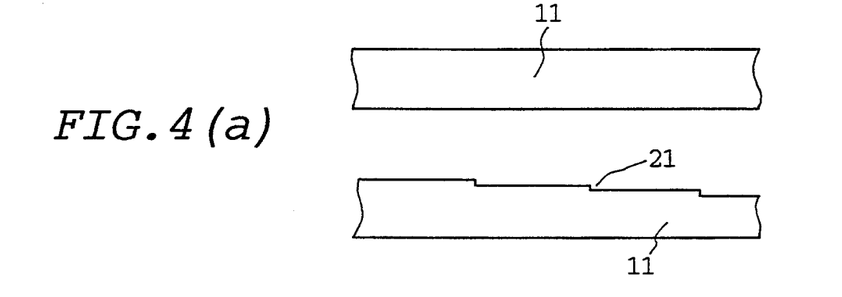
FIG. 4(a) to FIG. 4(d) are sectional views for explaining a process of the formation of GaAs-on-Si according to an embodiment of the present invention.
Figure 4B:
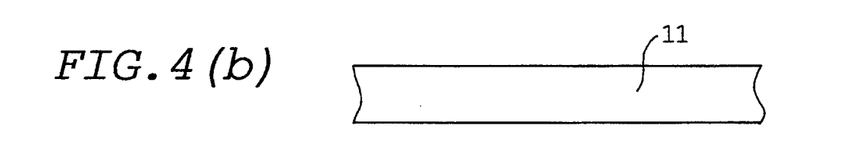
Figure 4C:
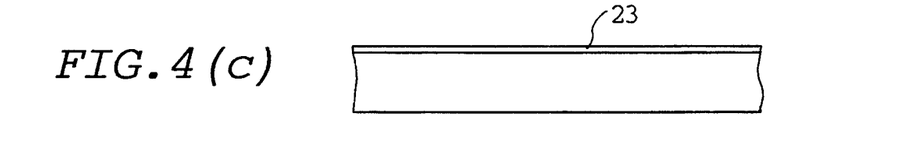
Figure 4D:
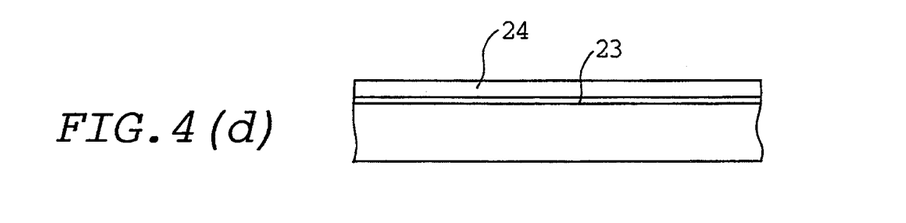

FIG. 4(a) shows the Si (100) substrate (the wafer) 11 (2° off toward [011]). Besides, the view under FIG. 4(a) shows an enlarged section of the surface of the Si substrate 11 before preprocessing. By a 2° tilt from the plane (100) toward [011], the surface of the Si substrate 11 has steps 21 in a predetermined period. Further, it is deemed that the single crystal GaAs film is grown from these steps 21.

First, such a Si substrate 11 is held by the wafer tray 10. Then, after the tray 10 is placed in the reactor (a growth chamber) 3 above the susceptor 8 of the MOCVD apparatus, the pressure in the chamber 1 is reduced.

When the pressure in the chamber 1 reaches a predetermined pressure, prebaking is started in accordance with the temperature sequence shown in FIG. 3. Explaining in detail, $H_2$ gas passing through liquid trimethylgallium (TMG) held at a temperature of 15° C. and containing TMG is introduced into the chamber 1. Then, the pressure in the chamber 1 is held at 76 Torr. Then, after the Si substrate 11 is heated by a heater provided in the susceptor 8 and the temperature of the Si substrate 11 reaches 875° C., the Si substrate 11 is held in this state for 10 minutes (FIG. 4(b)). At this time, since the Si substrate 11 is covered by hydrogen gas containing gallium, particles remaining on the inner wall or the like of the MOCVD apparatus are prevented from reaching the Si substrate 11. Further, since the temperature of heating the Si substrate 11 is 750° C. or higher, the natural oxide film formed on the surface of the Si substrate 11 is governed by temperature rise due to heating rather than the chemical reaction with gas and thus removed. Further, since the heating temperature is 875° C. or below, the gas is not degenerated. Furthermore, since TMG scarcely reacts on the natural oxide film, gallium in TMG remains on the surface of the Si substrate 11 after heat processing.

Next, after the temperature of the Si substrate 11 is lowered to 400° C. in accordance with the temperature sequence shown in FIG. 3, $H_2$ gas having a flow rate of 12 SLM, $AsH_3$ gas having a flow rate of 0.4 SLM and $H_2$ gas having a flow rate of 100 SCCM which has been made to pass through a TMG liquid at the temperature of 15° C. are introduced into the chamber 1 in the same MOCVD apparatus. After the Si substrate 11 is held in such a state for approximately 4 minutes, a GaAs initial film 23 having a film thickness of approximately 100 Å which becomes a growth nucleus is grown on the Si substrate 11 (FIG. 4(c)).

Then, the temperature of the Si substrate 11 is raised in accordance with the temperature sequence shown in FIG. 3 and maintained at 650° C. in the same MOCVD apparatus. In succession, $H_2$ gas having a flow rate of 12 SLM, $AsH_3$ gas having a flow rate of 0.1 SLM and $H_2$ gas having a flow rate of 14 SCCM which has passed through the TMG liquid at a temperature of 15° C. are introduced into the chamber 1. When this state is maintained for approximately 42 minutes, a single crystal GaAs film 24 having a film thickness of 3 μm is grown (FIG. 4(d)). Thus, GaAs-on-Si is completed.

As described above, according to a process of the formation of GaAs-on-Si in an embodiment of the present invention, the growth of a GaAs film on the surface of the Si substrate 11 after preprocessing is not prevented since the natural oxide film on the surface has been removed by preprocessing of the surface of the Si substrate 11. Further, particles remaining on the inner wall or the like of the MOCVD apparatus are prevented from reaching the Si substrate 11, and furthermore, the gas is not degenerated. Therefore, abnormal growth and defects of the GaAs film by degeneration of the gas and particles are prevented.

Besides, the Si (100) substrate 11 (2° off toward [011]) is used in the embodiment, but it is also possible to use a Si (100) substrate (1° to 4° off toward <011>).

Further, metal organic chemical vapor deposition (MOCVD) is used for the formation of the GaAs film, but molecular beam epitaxy (MBE) or atomic layer epitaxy (ALE) may also be used.

Figure 5:
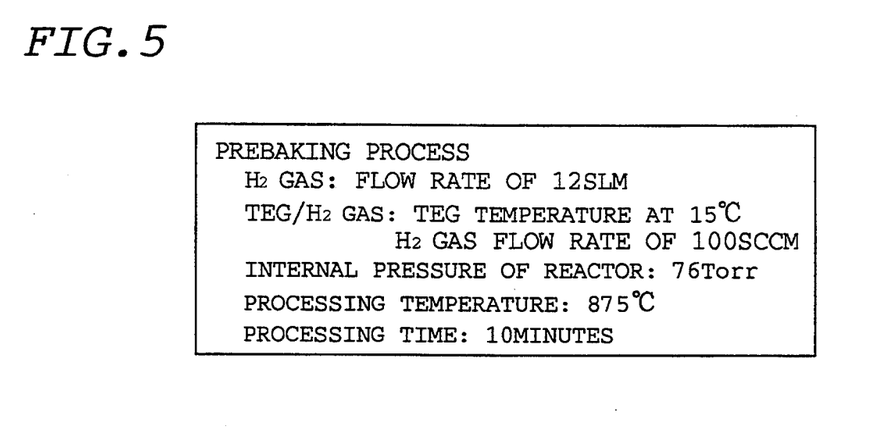
FIG. 5 is an explanatory diagram on a prebaking process according to another embodiment of the present invention.

Furthermore, trimethylgallium (TMG) is used as the gas composed of an organic substance of a IIIB group element, but triethylgallium (TEG) may also be used. The prebaking conditions in this case are shown in FIG. 5.

Figure 6:
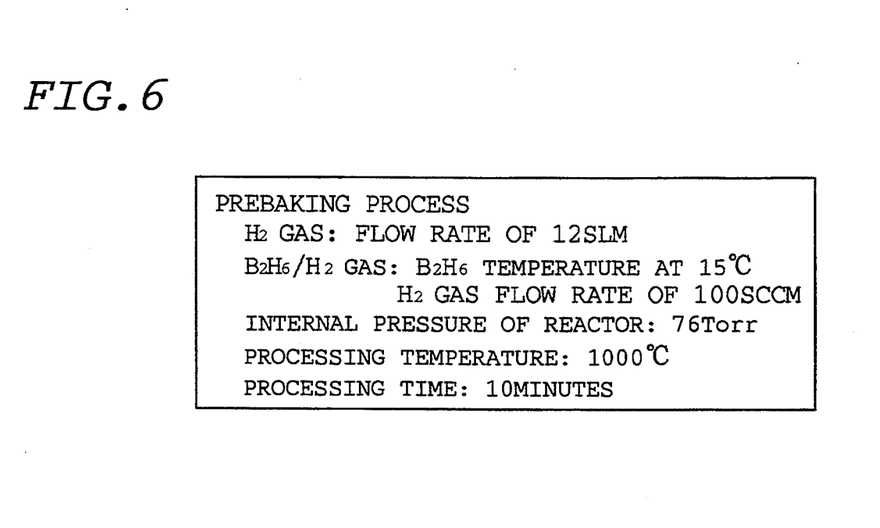
FIG. 6 is an explanatory diagram on a prebaking process according to still another embodiment of the present invention.

Further, diborane ($B_2H_6$) gas for instance may be used as the gas composed of a hydride of a IIIB group element. In this case, the substrate temperature is maintained at 850° C. or higher which is the decomposition temperature of diborane and at 1,200° C. or below at which no gas degeneration occurs. The prebaking conditions are shown in FIG. 6.

Presumably, the reason why the gas composed of a chloride of a IIIB group element is not used as ambient gas for heat processing is that, when a natural oxide film exists on the surface of the silicon substrate, chlorine and silicon react to each other and gallium combines with oxygen thereby to evaporate, and no gallium remains on the surface of the silicon substrate. As a result, such a surface as the present invention that is able to form a GaAs film having little unevenness and little crystal defects on the surface is not obtainable.

(2) Relative investigation on flatness and crystallinity of the GaAs film 24

Next, the flatness and the crystallinity of the GaAs film formed by a process of the formation of heteroepitaxy according to an embodiment of the present invention have been investigated. The results thereof will be described hereunder.

(a) Investigation on flatness

First, the results of investigation on the flatness of the GaAs film 24 formed by the process of the formation in the above-described embodiment will be described. For the purpose of comparison, the flatness of a GaAs film 32 formed by a conventional process of the formation was investigated in a similar manner.

The investigation on the flatness was made by observing unevenness of the surfaces of the GaAs films 24 and 32 by an AFM. The results are shown in TABLE 1. Numerals in TABLE 1 show standard deviation of the height of projections on the reference plane of the GaAs film surface.

TABLE 1

|  | Conventional example | Embodiment of the present invention |
| --- | --- | --- |
| Flatness | 3.90–4.10 (nm) | 3.30–3.50(nm) |

According to TABLE 1, the height of projections is decreased and the flatness is increased as compared with the surface of the GaAs film formed by a conventional example.

(b) Investigation on crystallinity

The crystallinity was investigated with respect to the same GaAs film 24. Besides, the GaAs film 32 formed by a conventional process of the formation was also investigated in a similar manner for the purpose of comparison.

The investigation was made by measuring (400) peak half-width by X-ray two crystal diffraction, and the (400) peak half-width shows the extent of lattice strains of the GaAs films 24 and 32.

The results are shown in TABLE 2. Numerals in TABLE 2 show (400) peak half-width.

TABLE 2

|  | Conventional example | Embodiment of the present invention |
|---|---|---|
| Crystallinity | 240-250 ('') | 220-230 ('') |

According to TABLE 2, the (400) peak half-width is reduced as compared with the surface of the GaAs film formed by a conventional example, which shows improvement of lattice strains.

As described above, the GaAs film 24 having smooth flatness and good crystallinity on the surface of the Si substrate 11 after preprocessing was formed by means of preprocessing of the Si substrate 11 according to an embodiment of the present invention.

Next, crystal structures of GaAs films in an embodiment of the present invention and a conventional example were investigated and compared with each other for the purpose of exploring what is the cause of difference in the flatness and the crystallinity of the GaAs films 24 and 32 between the embodiment of the present invention and the conventional example.

(3) Investigation of crystal structure of GaAs film

In order to investigate the crystal structure of a GaAs film, the configuration of an etch pit and the sectional configuration of a trench were investigated. The process and the results thereof will be described below.

(a) Investigation of the configuration of the etch pit

After etching the surface layers of the GaAs films 24 and 32 for 15 seconds by wet etching using a KOH liquid at a temperature of 370° C., etch pits were observed.

Figure 7A:
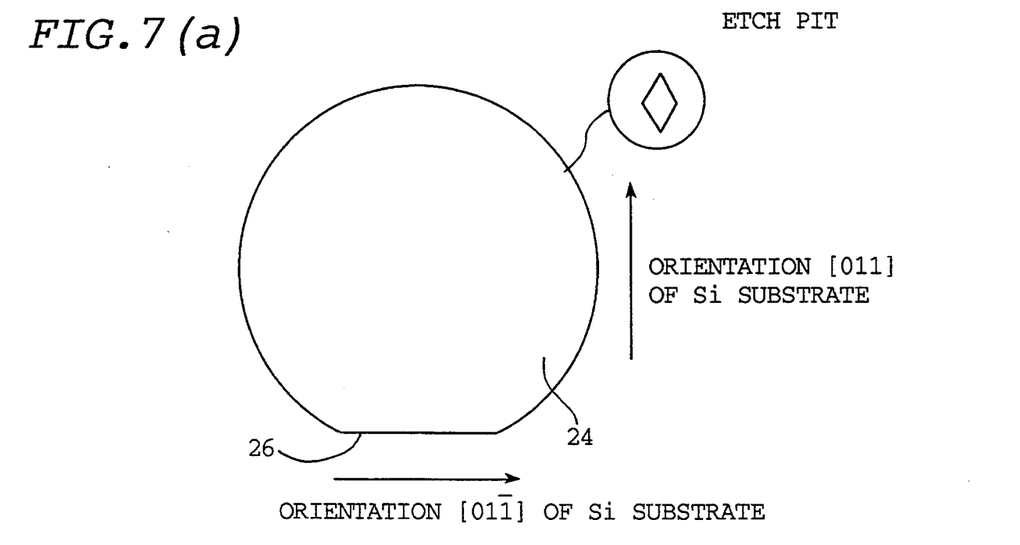
FIG. 7(a) and FIG. 7(b) are plan views for explaining the result of observation on etch pits of a GaAs film formed by a process of the formation according to an embodiment of the present invention.
Figure 7B:
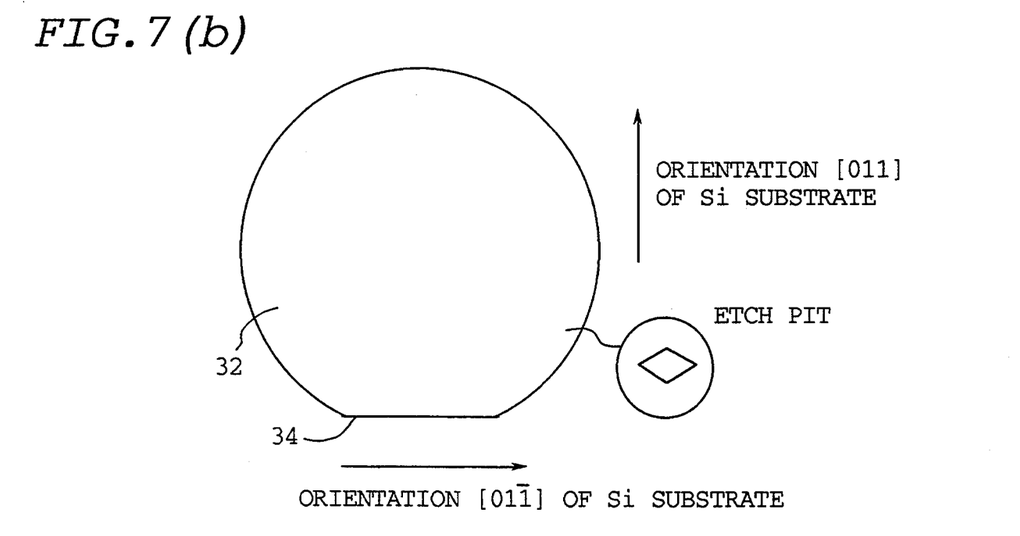

The results are shown in FIG. 7(a) for the GaAs film 24 according to the embodiment of the present invention, and in FIG. 7(b) for the GaAs film 32 in the conventional example.

According to the results, in the GaAs film 24 in the embodiment of the present invention, rhomb-like etch pits with edge portions having acute angles toward [011] appeared on the whole surface of the GaAs film 24. Further, in the case of the GaAs film 32 in the conventional example, rhomb-like etch pits with edge portions having acute angles toward [011] meeting at right angles with [011] appeared partially on the surface of the GaAs film 32. Besides, [011] indicates an orientation perpendicular to the orientation flat of the Si substrate 11, and [011] indicates an orientation parallel to an orientation flat 34 of a Si substrate 31.

Through the observation described above, it has become clear that the orientations of edge portions having acute angles of etch pits are different from each other in the embodiment of the present invention and the conventional example. This shows that crystal structures are different from each other. Thus, it has also become clear that it is possible to determine the quality of flatness and crystallinity of a GaAs film grown epitaxially on a Si substrate depending on the state of formation of etch pits.

(b) Investigation of sectional configurations of trenches

Next, wet etching is applied to the GaAs film 24 using a persulfuric acid ($H_2O_2/H_2SO_4$) solution, and belt-shaped trenches 25a and 25b at right angles to each other are formed on the GaAs film 24. The orientations of the trenches 25a and 25b are [011] and [011], respectively. Further, similar processing is performed on the GaAs film 32 formed on the Si substrate 31 by a conventional process. Then, sectional configurations of trenches 33a and 33b formed in the orientations [011] and [011], respectively, were observed.

Figure 8:
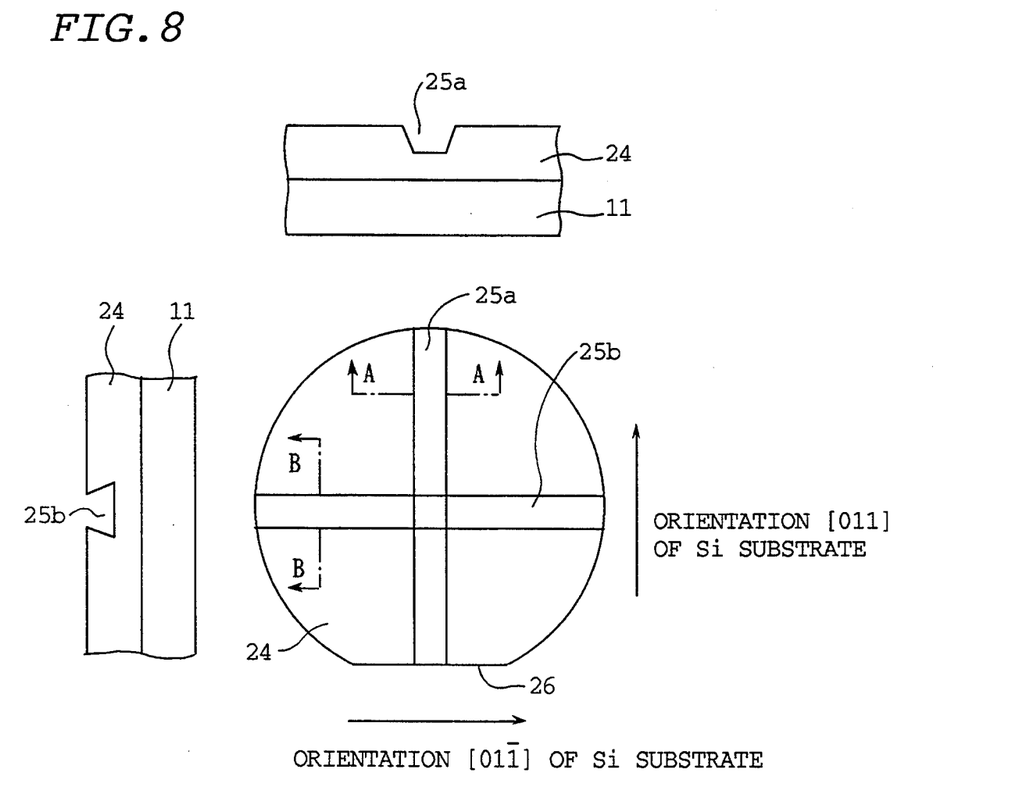
FIG. 8 is an explanatory view (-1) on a sectional configuration of trenches of a GaAs film formed by a process of the formation according to an embodiment of the present invention.

As a result, in the case of the GaAs film 24, the width at the bottom part of the trench 25a becomes narrower than the width of the top part thereof in the orientation [011] as shown in FIG. 8. On the other hand, the width at the bottom part of the trench 25b becomes wider than the top part thereof in the orientation [011].

Figure 9:
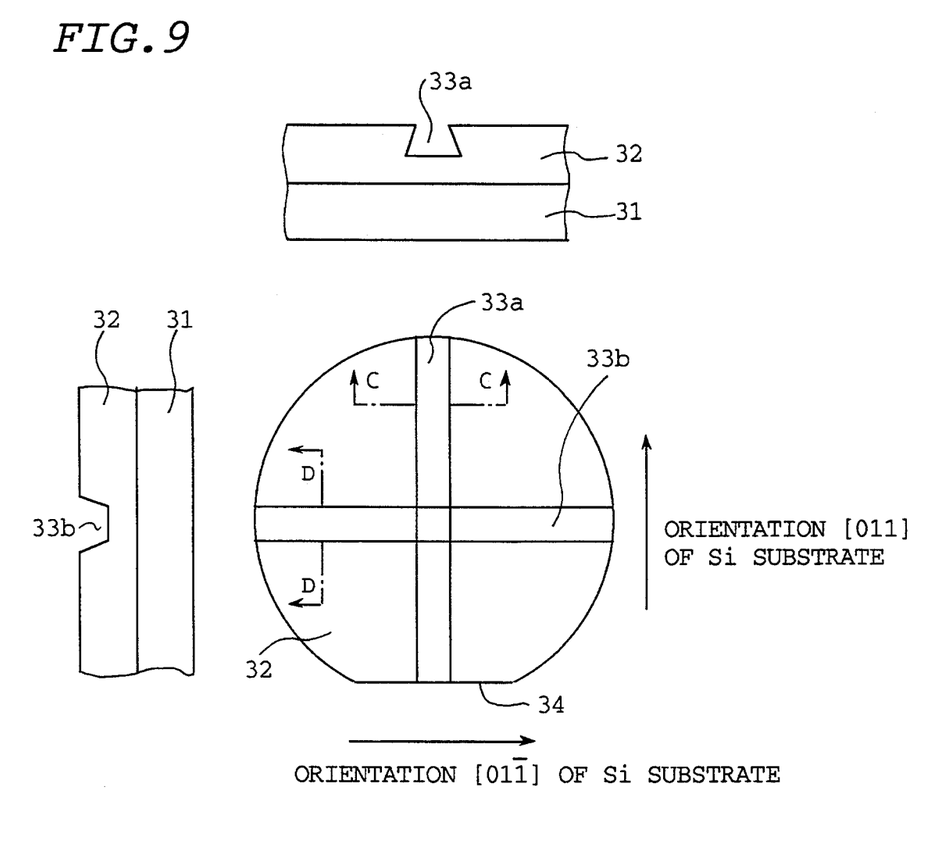
FIG. 9 is an explanatory view (-2) on a sectional configuration of trenches of a GaAs film formed by a process of the formation according to an embodiment of the present invention.

Further, in the case of the GaAs film 32 according to the conventional example shown in FIG. 9, the configurations of the trenches 33a and 33b show sectional configurations reverse to the case of the present invention. Namely, in the orientation [011], the width of the bottom part of the belt-shaped trench 33a formed on the GaAs film 32 becomes wider than the width of the top part thereof, and in the orientation [011], the width of the bottom part of the trench 33b becomes narrower than the width of the top part thereof.

As described above, it has been ascertained that the crystal structures of the GaAs films 24 and 32 in the embodiment of the present invention and the conventional example are different from each other also by the observation of sectional configurations of the trenches in a similar manner as the observation of configurations of the etch pits. Accordingly, it has also become clear that it is possible to determine the quality of flatness and crystallinity of a GaAs film by observing sectional configurations of belt-shaped trenches formed in the GaAs film in orientations [011] and [011].

Thus, it is possible to presume that the quality of flatness and crystallinity of a GaAs film depends upon the difference in the crystal structure through two types of observation. Furthermore, the difference in the crystal structure is presumed to be caused by the difference in the surface of the Si substrate. Namely, it is conceivable that the fact that gallium remains on the surface of the Si substrate is a factor for improving the flatness and the crystallinity. Besides, similar results as the case of TMG are also obtainable in case TEG is used and in case diborane ($B_2H_6$) gas containing boron of a IIIB group element is used as gas composed of an organic substance containing a IIIB group element.

What is claimed is:

1. A process of the formation of heteroepitaxy comprising the steps of:

heating a silicon substrate in a IIIB group element gas including one of trimethylgallium (TMG) gas and triethylgallium (TEG) gas with a higher temperature than a depositing temperature of a single crystal GaAs layer and having the IIIB group element remain on a surface of the silicon substrate;

forming a GaAs initial layer on the silicon substrate while heating the silicon substrate with a lower temperature than the depositing temperature; and forming a single crystal GaAs layer on the silicon substrate while heating the silicon substrate with the depositing temperature.

2. A process of the formation of heteroepitaxy according to claim 1, wherein said heating step includes the step of providing the higher temperature between 750° C. and 875° C.

3. A process of the formation of heteroepitaxy comprising the steps of:

heating a silicon substrate in a IIIB group element including diborane ($B_2H_6$) with a higher temperature than a depositing temperature of a single crystal GaAs layer and having the IIIB group element remain on a surface of the silicon substrate;

forming a GaAs initial layer on the silicon substrate while heating the silicon substrate with a lower temperature than the depositing temperature; and forming a single crystal GaAs layer on the silicon substrate while heating the silicon substrate with the depositing temperature.

4. A process of the formation of heteroepitaxy according to claim 3, wherein said heating step includes the step of providing the higher temperature between 850° C. and 1200° C.

5. A process of the formation of heteroepitaxy according to claim 1, further including the step of performing all of said steps in a same film forming apparatus.

6. A process of the formation of heteroepitaxy according to claim 1, further including the step of providing said silicon substrate at a (100) plane being 1° to 4° off toward <011>.

7. A process of the formation of heteroepitaxy according to claim 1, further including the step of forming said GaAs film by one of metal organic chemical vapor deposition, molecular beam epitaxy and atomic layer epitaxy.

* * * * *